US006839271B1

United States Patent
Anthony et al.

(12) United States Patent
(10) Patent No.: US 6,839,271 B1
(45) Date of Patent: Jan. 4, 2005

(54) MAGNETIC MEMORY DEVICE

(75) Inventors: Thomas C. Anthony, Sunnyvale, CA (US); Frederick A. Perner, Palo Alt, CA (US); Heon Lee, Pohang-Si (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/685,618

(22) Filed: Oct. 15, 2003

(51) Int. Cl.[7] .............................................. G11C 11/00
(52) U.S. Cl. ........................ 365/158; 365/97; 365/213
(58) Field of Search ........................ 365/158, 97, 213, 365/209

(56) References Cited

U.S. PATENT DOCUMENTS

| | | |
|---|---|---|
| 5,224,068 A | 6/1993 | Miyake et al. |
| 5,396,455 A | 3/1995 | Brady et al. |
| 5,444,651 A | 8/1995 | Yananoto et al. |
| 5,640,343 A | 6/1997 | Gallagher et al. |
| 5,761,110 A | 6/1998 | Irrinki et al. |
| 5,933,365 A | 8/1999 | Klersy et al. |
| 5,936,882 A | 8/1999 | Dunn |
| 5,953,245 A | 9/1999 | Nishimura |
| 5,956,295 A | 9/1999 | Yamakawa et al. |
| 6,016,290 A | 1/2000 | Chen et al. |
| 6,188,615 B1 * | 2/2001 | Perner et al. ................. 365/97 |
| 6,744,651 B2 * | 6/2004 | Tang ........................... 365/158 |

OTHER PUBLICATIONS

Hewlett–Packard published application No. 20020089874, serial 758757, filed Jan. 11, 2001, Thermally–assisted switching of magnetic memory elements, Nikel, et al.
Hewlett–Packard published patent application No. 20030123282, serial 315748, filed Dec. 10, 2002, Thermally–assisted switching of magnetic memory elements, nikel, et al.
Ryan, Mason & Lewis, LLP published patent application 20030198113, serial 128838, filed Apr. 23, 2002, Memory storage device with heating element, Abraham, David W.; et al.

* cited by examiner

Primary Examiner—Huan Hoang

(57) ABSTRACT

A magnetic memory device which comprises a magnetic memory cell that includes a magnetic material switchable between two resistive states on the application of a magnetic field. The device also comprises a wire that is connected to the magnetic memory cell and has a conductive connecting link and a conductive word or bit line which are electrically connected to each other. The connecting link is disposed between the word or bit line and the magnetic memory cell and has a thermal resistance that is larger than that of the word or bit line so as to provide a barrier for heat conduction from the magnetic memory cell to the word or bit line.

8 Claims, 2 Drawing Sheets

MAGNETIC MEMORY DEVICE

FIELD OF THE INVENTION

The present invention relates to magnetic memory devices, and more specifically to methods of and structures for storing data in a magnetic memory device.

BACKGROUND OF THE INVENTION

Non-volatile magnetic random access memory (MRAM) devices have the potential to replace volatile dynamic random access memory (DRAM) devices and static random access memory (SRAM) devices in some applications. The MRAM devices comprise arrays of cells operating on tunneling magneto-resistance (TMR), colossal magneto-resistance (CMR), and giant magneto-resistance (GMR) technology.

MRAM cells are typically structured around "data" and "reference" layers. The data layer includes a writeable magnetic material, and the reference layer includes a fixed magnetic material. A dielectric layer in between the two has greater or lesser resistance to electrical current depending on whether the magnetic fields from the sandwiching layers are canceling or reinforcing one another.

During a write operation, the magnetization of the data layer can be switched between two opposite states by applying an electromagnetic field through a nearby wire loop. Thus binary information can be stored. The reference layer usually comprises a magnetic material in which the magnetization is pinned. A magnetic field applied to the data layer penetrates the reference layer with insufficient strength to switch the magnetization in the reference layer.

For example, in a TMR cell, the data layer and the reference layer are separated by a thin dielectric layer so that a tunneling junction is formed. The probability that electrons will be able to tunnel through the dielectric layer depends on the direction of the magnetization in the data layer relative to the direction of the magnetization in the reference layer. Therefore, the structure is "magneto-resistant" and information can be stored and retrieved by reading the magnitude of tunneling currents thereafter able to pass through the memory cell.

In general, it is of advantage that the magnetic memory cells are as small as possible to increase memory density and reduce cost. However, as cells become smaller, thermal stability issues become more important. To ensure that stored information is not lost because of random switching induced by environmental influences, it is necessary that the data layers of small magnetic memory cells are such that the magnetic field strength that is required for switching the magnetization is higher than that for larger memory cells. Unfortunately the necessity to generate the larger fields strength makes switching of the memory cells during the write operation more difficult.

It is known that increasing the temperature of the magnetic memory cell lowers the magnetic field strength that is required for switching. Further, when an electrical current passes through the magnetic memory cell, heat is developed in the cell. However, the developed heat is easily conducted through the bit lines away from the memory cell and therefore cannot be utilized to facilitate switching of the magnetic memory cell.

There is therefore a need for a magnetic memory device in which loss of heat from the magnetic memory cell is reduced and therefore the heat can be utilized to facilitate switching.

SUMMARY OF THE INVENTION

Briefly, a magnetic random access memory (MRAM) embodiment of the present invention comprises a magnetic memory cell switchable between two states of differing electrical resistance of an interposing dielectric layer under the influence of a magnetic field. The MRAM also comprises a wire that is connected to the magnetic memory cell. The conductive line has a conductive connecting link and a conductive word or bit line which are electrically connected to each other. The connecting link is disposed between the word or bit line and the magnetic memory cell and has a thermal resistance that is larger than that of the word or bit line so as to provide a barrier for heat conduction from the magnetic memory cell to the word or bit line.

The invention will be more fully understood from the following description of embodiments of the invention. The description is provided with reference to the accompanying drawings.

DETAILED DESCRIPTION OF EMBODIMENTS

Figure 1:
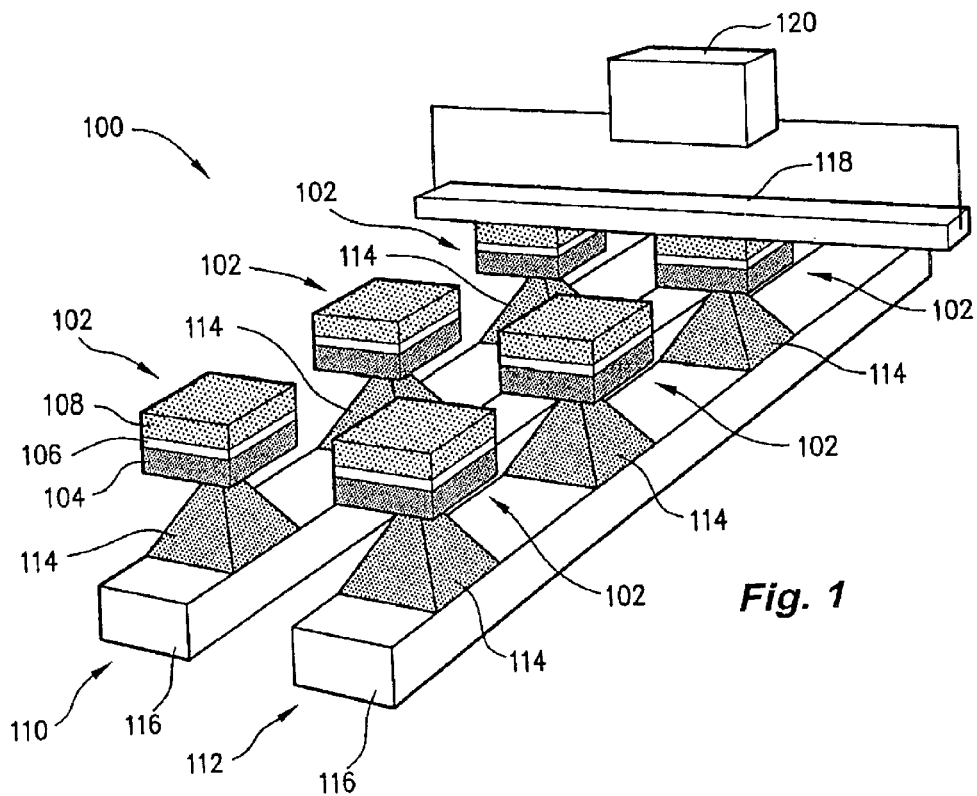
FIG. 1 is a perspective diagram of a magnetic memory device according to an first embodiment of the present invention.

FIG. 1 represents a first magnetic random access memory (MRAM) embodiment of the present invention, and is referred to herein by the general reference numeral 100. The MRAM 100 comprises a number of individual magneto-resistance memory cells 102. In this case each memory cell 102 is a tunneling magneto resistance memory (TMR) cell. Each memory cell 102 comprises a magnetic reference layer 104, a dielectric layer 106 and a magnetic data layer 108. The device comprises electrically conductive word lines 110 and 112, respectively. These are typically metal, e.g., aluminum or copper. Both of which materials are good heat conductors.

The word lines 110 and 112 can heat sink memory cells 102 pretty effectively, and any localized heating could be carried away quickly. But if some of this local heating was allowed to pile at each active memory cell 102, the heat can be used to make switching the data layer 108 a bit easier. And so in lies the present invention. Therefore a connecting link 114 has a narrowed neck that reduces the thermal path to the metal in word lines 110 and 112. The connecting links 114 are formed as cones or pyramids.

The MRAM 100 comprises wires such as word lines 110 and 112 having connecting links and word or bit lines, which in this example, are connecting links 114 and rails 116 respectively. The connecting links have a thermal resistance that is larger than that of the word or bit lines so that a barrier for heat conduction is provided. In this example, the connecting links 114 are surrounded by a low thermal conductivity material, e.g., $SiO_2$. A heat barrier is established because of the reduced cross-sectional area of the connecting links 114 though which heat can be conducted. Consequently more of the heat generated by the memory cell can be utilized to facilitate switching of the magnetic memory cell 114.

Each magnetic memory cell 102 is also connected to a bit line so that the magnetic memory cells are disposed between word lines 110 and 112 and bit lines 118. For clarity only one bit line 118 is shown.

The data layer 108 includes a magnetic material which is selected so that the direction of the magnetization is switchable as a function of an applied magnetic field. In general, MRAM 100 is such that the magnetization in the data layer 108 can have two opposing directions so that binary information can be stored as a function of the direction of the magnetic field generated by the current applied to bit line 118 and/or word line 104. When a current is applied along a bit line and/or a word line, a magnetic field will surround the bit line and/or word line which can be utilized to switch the magnetization of the data layer 108.

FIG. 1 schematically indicates a circuit unit 120 that in use generates the write current through the bit line 118. The circuit may also generate a write current through the word lines 110 and 112. For clarity, electrical connections to the circuit unit 120 are not shown for word lines 110 and 112. Each magnetic memory cell may comprise a number of additional layers which are not shown for simplicity.

Dielectric layer 106 is thin enough so that, when a suitable electrical potential is applied between word line 110 or 112 and bit line 118, a tunneling current will flow through the dielectric layer 106. The tunneling probability and therefore the effective resistance of the memory cell depends on the direction of the magnetization in the data layer 108 relative to that of the reference layer 104. Therefore, it is possible to determine the orientation of the magnetization in the data layer from the tunneling current which is dependent on the resistance of the memory cell 102.

MRAM 100 further includes a read circuit for sensing the resistance of selected memory cells 102 during read operations. During read operations, a constant supply voltage or a ground potential is applied across the magnetic memory cells 102. The constant supply voltage may be provided by an external circuit. The read circuit is not shown in order to simplify the description.

MRAM 100 may comprise an array having any number of memory cells 102 arranged in any number of rows and columns. Further, MRAM 100 may comprise other magnetic memory cells such as colossal magneto resistance memory cells (CMR) or giant magneto resistance memory (GMR) cells.

The connecting links 114 may include aluminum, tungsten, copper, amorphous carbon, doped amorphous or doped poly-crystalline silicon, or any conductive material. A possible material is an electrically conductive amorphous material, such as amorphous silicon or amorphous carbon, owing to the higher thermal resistivity of the amorphous state. Each connecting link 114 has a reduced area top-surface that is, in this example, in contact with a reference layer of a respective magnetic memory cell. It will be appreciated that the connecting links 114 may not be in contact with the magnetic material of the magnetic memory cells 102. For example, layers of further material may be disposed between the connecting links 114 and the magnetic material of respective magnetic memory cells 102.

Alternatively the connecting links 114 need not be pyramidal shape, but may have any other suitable shape including conical or generally cylindrical shapes or shapes that approximate that of rectangular prisms which project from the rails such as 114 and 116. Word lines 110 and 112 may also operate as bit lines. Each magnetic memory cell may comprise a number of additional layers such as capping, AF and seed layers.

In a specific example of this embodiment, the connecting links 114 have a height of approximately 100 nm and a base area of approximately 150×150 nm. Each contact surface between the magnetic memory cells 302 and the connecting links 114 has an area of less than approximately 50×50, and possibly as small as 10×10 nm. The word lines 110 and 112 may comprise copper and each word line 110 or 112 together with respective connecting links 114 may be integrally formed. In this example, however, the connecting links 114 may comprise doped amorphous silicon.

Here, the data layer 108 includes nickel iron (NiFe), the reference layer 104 includes cobalt iron (CoFe) and the dielectric layer 106 includes $Al_2O_3$. These layers have the same planar area of approximately 150 nm×300 nm, and the reference layer 104, the data layer 108 and the dielectric layer 106 have a thickness of approximately 3.5 nm, 3 nm, and 1.2 nm respectively.

The connecting links 114 may be fabricated by using conventional via processing techniques and adjusting the via etch parameters to selectively lateral etch the top of the via more than the base of the via. Initially copper lines 110 and 112 are fabricated using a copper damascene processes. A layer of conducting via material such as doped amorphous silicon and approximately 100 nm thick, is deposited over the patterned bit lines. A positive resist photolithography process is used to define the location and size of the pyramidals. This is followed by an isotropic etch process that will result in a pyramidal structure. A thick layer of $SiO_2$ is deposited and chemical-mechanically polished (CMP) to yield a flat surface with the tops of the pyramidals exposed to make contact to the memory cells 102. The memory cell layers 104, 106, and 108 are deposited and the fabrication process is completed.

Figure 2:
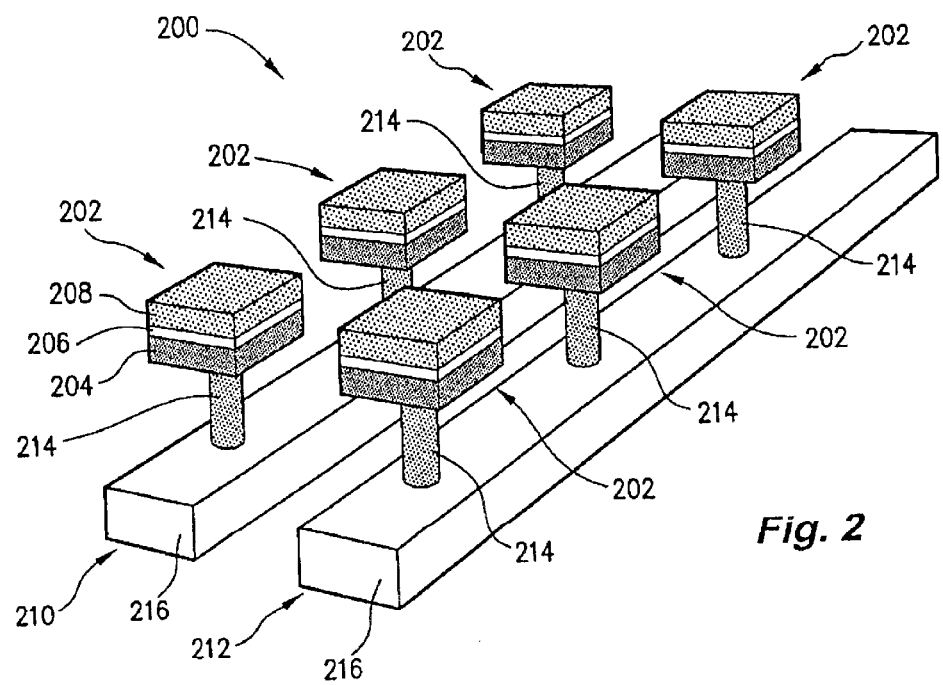
FIG. 2 is a perspective diagram of a magnetic memory device according to a second embodiment of the present invention.

FIG. 2 shows a second embodiment of the MRAM device. FIG. 2 shows a of the device 200 comprising magnetic memory cells 202. Each magnetic memory cell comprises a reference layer 204, a dielectric layer 206 and a data layer 208. The structure and composition of the magnetic memory cells 202 is analogous to that of magnetic memory cells 102 shown in FIG. 1 and discussed above. The device comprises wires such as word lines 210 and 212 having connecting links and word or bit lines, which in this example, are vias 214 and rails 216 respectively. The vias 214 are conductive and may comprise aluminum, tungsten, copper, amorphous carbon, doped amorphous or doped poly-crystalline silicon, etc. In this embodiment, each via 214 is positioned around a cylinder of insulating material. It will be appreciated that the vias 214 may not be in contact with the magnetic material of the magnetic memory cells 202. For example, layers of other material may be disposed between vias 214 and the magnetic material of respective magnetic memory cells 202.

It will also be appreciated that alternatively via 214 may be of any other tubular shape including shapes that have a rectangular cross-sections. The word lines 210 and 212 may also operate as bit lines. Further, each magnetic memory cell may comprise a number of additional layers such as capping, AF and seed layers.

In an example of this embodiment, the vias 214 have a height of approximately 100 nm and a diameter of less than approximately 150 nm. Each contact surface between the magnetic memory cells 202 and the pyramidals 214 has an area of less than approximately 50×50 nm and possibly as small as 10×10 nm. The word lines 210 and 212 may comprise copper and the vias 214 may comprise doped silicon and are centered around a core cylindrical core of $SiO_2$.

The vias 214 may be fabricated using a combination of known semiconductor processing methods including spacer fabrication and chemical-mechanical polishing. For example, first a layer of electrically and thermally insulating material, such as $SiO_2$, is deposited to a thickness at least as great as the final desired thickness of the via 214. This layer is then patterned into cylindrical regions on top of word lines 210 and 212 using standard photolithographic and etching processes. A conductive spacer is then formed around the perimeter of the cylindrical region by first depositing a conformal layer of conductive material. Then using an anisotropic etch to remove the conductive material everywhere except from the vertical side walls of the cylindrical regions. A thick layer of $SiO_2$ is deposited and chemical-mechanically polished (CMP) to yield a flat surface with the tops of the vias exposed to make contact to the memory cells 202. The memory cell layers 204, 206, and 208 are deposited and the fabrication process is completed. In this manner memory cells 202 are electrically connected to word lines 210 and 212 through vias 214.

The device 200 comprises an array of the magnetic memory cells and a plurality of electrically bit lines and word lines each connected to a plurality of magnetic memory cells. The device 200 also comprises bit lines and circuitry such as 110 which is for clarity not illustrated in FIG. 2.

Figure 3:
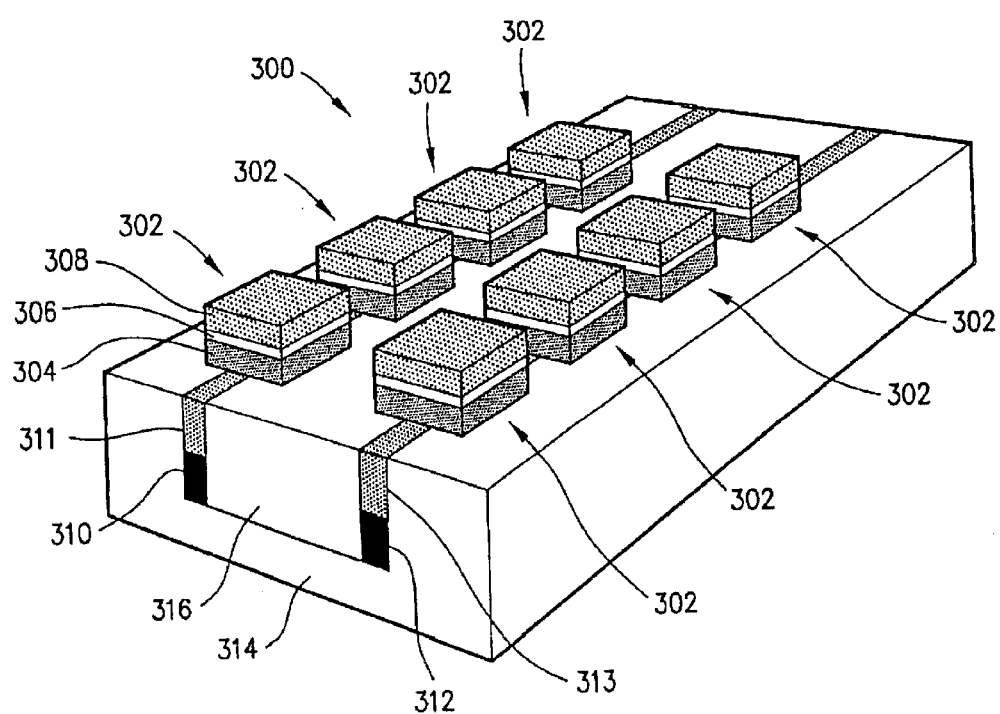
FIG. 3 is a perspective diagram of a magnetic memory device according to third embodiment of the present invention.

Referring now to FIG. 3, a MRAM embodiment of the present invention is referred to herein by the general reference numeral 300. MRAM 300 includes an array of magnetic memory cells 302. Each magnetic memory cell 302 comprises a magnetic reference layer 304, a tunneling dielectric layer 306 and a magnetic data layer 308. Each word line has two parts, a high conductivity backing rail 310 and 312, aqnd a lower conductivity cell contacting rail 311 and 313. These are disposed within electrically and thermally insulating substrates 314 and 316.

Although connecting links 311, 313 and word or bit lines 310, 312 are shown having equal widths in FIG. 3, the two can have different cross sectional geometries and materials.

To simultaneously minimize thermal conduction from the memory cell and maintain high electrical conductivity along the word lines, the width of the connecting links may be substantially smaller that the widths of the word or bit lines. For example, the connecting rail facings 311 and 313 can have a height and width of approximately 100 nm and 10 nm respectively, and the word or bit lines 310 and 312 have a height and width of approximately 200 nm and 200 nm respectively. The tops of the connecting rail facings 311 and 313 are in contact with respective reference 304 layer of respective magnetic memory cells 302. As the connecting rail facings 311 and 313 have only a relatively small cross-sectional area through which heat can be conducted to the word or bit lines 310 and 312, heatsinking from the magnetic memory cells 302 can be reduced. Consequently, more of the heat generated by the memory cell will linger to facilitate data switching.

The connecting links may comprise doped amorphous silicon which has a higher thermal resistance than copper, and further reduces the loss of heat. The word or bit lines 310 and 312 may comprise copper which has a relatively low electrical resistance and the word or bit lines carry a larger current than the connecting rail facings 311 and 313.

It will be appreciated that alternatively the connecting rail facings 311 and 313 may not be in contact with the magnetic material of the magnetic memory cells 302. For example, layers of further material may be disposed between the magnetic material of the magnetic memory cells 302 and the connecting rail facings 311 and 313. In addition, it will be appreciated that alternatively the word lines may also operate as bit lines.

Here, the data layer 308 includes nickel iron (NiFe), the reference layer 304 includes cobalt iron (CoFe) and the dielectric layers 306 may comprise $Al_2O_3$. These layers have the same planar area of approximately 150 nm×300 nm, and the reference layer 304, the data layer 308 and the dielectric layer 306 have a thickness of approximately 3.5 nm, 3.0 nm, and 1.2 nm respectively.

One method of manufacturing a bit line such as 310 and 312 includes the following steps. Initially a channel is etched into a dielectric substrate. Then the dielectric substrate and the interior of the channel are coated with a metallic material such as copper so as to fill the channel. A thin diffusion barrier or adhesion layer of a material such as Ta or TaN may precede the copper deposition. A chemical-mechanical polishing process is then used to planarized the copper line and the surrounding dielectric. A second dielectric material is then deposited over the planarized surface and etched into a channel such that one edge of the channel is positioned on top of, and parallel to, an underlying copper line. The second edge of the channel may be positioned on top of an adjacent copper line. Then the top surface of the second dielectric, the interior of the channel and the exposed Copper surface are coated with an electrical conductor that is a poor thermal conductor, such as doped amorphous silicon. In an anisotropic etch process, silicon is etched away from all areas except the channel walls so that silicon strips are formed. The channel is then filled with a third dielectric material and a chemical-mechanical polishing process is again used to planarize the silicon strips and surrounding dielectrics. On the planar structure magnetic memory cells are formed so that the memory cells are connected to edges the silicon strip.

Each magnetic memory cell 302 may comprise a number of additional layers such as capping, AF and seed layers. The MRAM 300 comprises an array of the magnetic memory cells and a plurality of bit lines and word lines, each connected to a plurality of magnetic memory cells. Further, the MRAM 300 also comprises bit lines and circuitry which is for clarity not illustrated in FIG. 3.

In general, the word or bit line may have a relatively low electrical resistance and may be suitable to carry a relatively large current. The connecting link may be shaped so as to cause the thermal resistance of the connecting link to be greater than that of the word or bit line and the thermal barrier may be established by reducing the cross-sectional area of the connecting link though which heat can be conducted from the magnetic memory cell to the second. Areas adjacent the connecting link may comprise a thermally and electrically insulating material. Alternatively or additionally the connecting link may comprise a material that is of a thermal resistivity higher than that of the word or bit line. For example, the connecting link may comprise amorphous silicon.

The resistance of the connecting link is preferably less than 10% of that of the magnetic memory cell itself. The connecting link is of a relatively low electrical resistance, which has electrical advantages, while providing a barrier for heat. The connecting links and word or bit lines may be connected to each other or may be integrally formed.

The wire may be a bit line. The wire may be a word line. The wire may also be one of two or more lines, for example, a bit line and a word line may be connected to the magnetic memory cell. The magnetic memory cell may has opposite faces and the conductive lines are connected to the opposite faces.

The connecting link may be in electrical contact with the magnetic memory cell. Alternatively, at least one layer may be disposed between the connecting link and the magnetic memory cell.

For example, the word or bit line may have a peripheral surface and the connecting link may be a link that projects towards the magnetic memory cell. In this case heatsinking can be reduced by reducing the cross-sectional area of the link through which the heat can be conducted and may be further reduced if the link comprises a material that has a thermal resistivity higher than that of the word or bit line. The magnetic memory cell has a face to which the wire is connected and the link has a zone in which the cross-sectional area through which heat can be conducted is smaller than approximately 20% of the area of the face of the magnetic memory cell. The link may have a base surface that is connected to the word or bit line.

The connecting link and the word or bit line may be integrally formed. The link may be of a generally cone-like or pyramidal form. The link may be of a tubular shape. In this case, the link also comprises a cylindrical core comprising an insulating material around which the tubular link is positioned.

The wire may have a generally uniform cross-sectional shape along its length. The first and word or bit line may be parallel. The magnetic memory cell may have a base surface and the area within which the connecting link is connected to the magnetic memory cell may be smaller than the base surface. In this case heatsinking is reduced as the cross-sectional area of the connecting link through which the heat can be conducted is reduced. The magnetic memory cell has a face to which the wire is connected and the connecting link has a zone in which the cross-sectional area through which heat can be conducted is smaller than approximately 20% of the area of the face of the magnetic memory cell. Heatsinking may be further reduced if the connecting link comprises a material that has a thermal resistivity higher than that of the word or bit line.

The magnetic memory device typically is one of an array of the magnetic memory devices. The device comprises a plurality of wires each connected to a plurality of magnetic memory cells.

The magnetic memory device a magnetic random access memory (MRAM) device. The MRAM device may be any type of MRAM device such as a colossal magneto resistance (CMR) memory device or a giant magnetoresististance (GMR) memory device but is a tunneling magneto resistance (TMR) memory device. The magnetic memory cell comprises a magnetic data layer a magnetic reference layer and a dielectric layer sandwiched between the data layer with the layers being such that a tunneling junction is formed at the dielectric layer.

The present invention provides in another embodiment a magnetic memory device comprising a magnetic memory cell including a magnetic material switchable between two states on the application of a magnetic field, a wire connected to the magnetic memory cell and disposed with an orientation that is chosen to reduce the conduction of heat from the magnetic memory cell into the wire.

The present invention provides in a further embodiment a magnetic memory device comprising an array of magnetic memory cells, each magnetic memory cell being switchable between two states of differing electrical resistance of an interposing dielectric layer under the influence of a magnetic field; and a plurality of wires; each conductive line connected to a plurality of magnetic memory cells and at least some of the wires having a conductive connecting link and a conductive word or bit line which are electrically connected to each other, each connecting link being disposed between a respective word or bit line and at least some of the magnetic memory cells and having a thermal resistance that is larger than that of the word or bit line so as to provide a barrier for heat conduction from the magnetic memory cell to the word or bit line.

A plurality of links may project towards respective magnetic memory cells from each word or bit line. Alternatively, at least some of the wires which comprise the connecting links and word or bit lines may have a generally uniform cross-sectional shape along their length.

The present invention also provides in an embodiment a magnetic memory device comprising a magnetic memory cell including a magnetic material switchable between two states on the application of a magnetic field. A wire is connected to the magnetic memory cell, the wire being a strip that has an edge and a major surface, the edge connected to the magnetic memory cell.

Although the invention has been described with reference to particular examples, it will be appreciated by those skilled in the art that the invention may be embodied in many other forms. For example, the magnetic memory cells may be colossal magneto resistance memory cells (CMR) or giant magneto resistance memory (GMR) cells. Further, it will be appreciated that the respective low thermal conductivity connecting links may contact the magnetic memory cells not only from below as shown in the Figs., but alternatively or additionally from above. In addition, the low thermal conductivity connecting links may not contact the magnetic memory at the center of their bottom of top face, but alternatively contact may be established closer to an edge of a magnetic memory cell.

What is claimed is:

1. A magnetic memory (MRAM) device comprising:
    an array of magnetic memory cells each with a magnetic data layer that can be switched between states, wherein switching is more readily accomplished at higher local temperatures;
    a grid of bit and word lines connected to and providing for data access to the array, wherein both a thermal and electrical conductive path exists for each magnetic memory cell in the array to the grid; and
    a plurality of thermally resistrictive links that electrically connect each respective magnetic memory cell in the array to corresponding points in the grid, and that increase the thermal resistance to heat generated in each of said magnetic memory cells;
    wherein, during operation an active magnetic memory cell is caused to heat to a higher temperature than otherwise because the corresponding thermally resistrictive link interfers with its heat sinking to respective bit and word lines, and therefore switches magnetic states with less applied energy.

2. The MRAM of claim 1, wherein:
    the plurality of thermally resistrictive links are each fabricated as metallic three-dimensional cones or pyramids.

3. The MRAM of claim 1, wherein:
    the plurality of thermally resistrictive links are each fabricated as metallic vias with cross sections smaller than the adjacent bit or word line.

4. The MRAM of claim 1, wherein:

the plurality of thermally resistive links are each fabricated of a less thermally conductive material than the word or bit lines.

5. A method for improving a magnetic memory (MRAM) device comprising:

laying out an array of magnetic memory cells each with a magnetic data layer that can be switched between states, wherein switching is more readily accomplished at higher local temperatures;

connecting a grid of bit and word lines to and providing for data access to the array, wherein both a thermal and electrical conductive path exists for each magnetic memory cell in the array to the grid; and electrically connecting a plurality of thermally resistictive links to each respective magnetic memory cell in the array that increase the thermal resistance to heat generated in each of said magnetic memory cells;

wherein, during operation an active magnetic memory cell is caused to heat to a higher temperature than otherwise because the corresponding thermally resistrictive link interfers with its heat sinking to respective bit and word lines, and therefore switches magnetic states with less applied energy.

6. A magnetic memory (MRAM) device comprising:

an array of magnetic memory cells each with a magnetic data layer that can be switched between states, wherein switching is more readily accomplished at higher local temperatures;

a grid of bit and word lines connected to and providing for data access to the array, wherein both a thermal and electrical conductive path exists for each magnetic memory cell in the array to the grid; and a plurality of thermally resistrictive rail facings that electrically connect each respective magnetic memory cell in the array to corresponding points in the grid, and that increase the thermal resistance to heat generated in each of said magnetic memory cells;

wherein, the plurality of thermally resistrictive rail facings are respectively disposed rail-for-rail on at least one of the bit and word lines in full contact along a row or column of the magnetic memory cells; and wherein, during operation an active magnetic memory cell is caused to heat to a higher temperature than otherwise because the corresponding thermally resistrictive link interfers with its heat sinking to respective bit and word lines, and therefore switches magnetic states with less applied energy.

7. The MRAM of claim 6, wherein:

the plurality of thermally resistrictive rail facings are each fabricated as reduced cross-sectional area wires compared to the word and bit lines.

8. The MRAM of claim 6, wherein:

the plurality of thermally resistrictive rail facings are each fabricated with materials having reduced thermal conductivity compared to the word and bit lines.

* * * * *